(12) United States Patent
Kim et al.

(10) Patent No.: US 11,832,482 B2
(45) Date of Patent: Nov. 28, 2023

(54) DOUBLE-SIDED EMISSIVE TRANSPARENT ORGANIC LIGHT-EMITTING DIODE DISPLAY AND METHOD OF MANUFACTURING THE SAME

(71) Applicant: LG Display Co., Ltd., Seoul (KR)

(72) Inventors: Taehan Kim, Paju-si (KR); Binn Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 96 days.

(21) Appl. No.: 16/219,089

(22) Filed: Dec. 13, 2018

(65) Prior Publication Data
US 2019/0189727 A1 Jun. 20, 2019

(30) Foreign Application Priority Data
Dec. 18, 2017 (KR) .......................... 10-2017-0174406

(51) Int. Cl.
*H10K 59/128* (2023.01)
*H10K 59/126* (2023.01)
*H10K 50/818* (2023.01)
*H10K 50/828* (2023.01)
*H10K 59/38* (2023.01)
(Continued)

(52) U.S. Cl.
CPC ......... *H10K 59/128* (2023.02); *H10K 50/818* (2023.02); *H10K 50/828* (2023.02);
(Continued)

(58) Field of Classification Search
CPC ............. H01L 27/3267; H01L 27/3272; H01L 2251/5323; H01L 25/048; H01L 27/3262;
(Continued)

(56) References Cited

U.S. PATENT DOCUMENTS

2003/0116768 A1* 6/2003 Ishikawa ............. H01L 27/1255
257/E27.113
2004/0129936 A1 7/2004 Park et al.
(Continued)

FOREIGN PATENT DOCUMENTS

CN 1516533 A 7/2004
CN 1766954 A 5/2006
(Continued)

OTHER PUBLICATIONS

Office Action dated Nov. 29, 2019, issued in corresponding Taiwanese Patent Application No. 107145170.
(Continued)

*Primary Examiner* — Sophia T Nguyen
*Assistant Examiner* — John Lin
(74) *Attorney, Agent, or Firm* — Morgan, Lewis & Bockius LLP

(57) ABSTRACT

A double-sided emissive transparent organic light-emitting diode display and method of manufacturing the same are provided. A double-sided emissive transparent organic light-emitting diode display includes: a substrate, a plurality of pixel areas, each including, on the substrate: a light transmitting area, and a light-emitting area, the light-emitting area including: a bottom light-emitting area including a bottom-emissive organic light-emitting diode, and a top light-emitting area including: a top-emissive organic light-emitting diode, a plurality of bottom driving elements under the top-emissive organic light-emitting diode, the bottom driving elements being configured to drive the bottom-emissive organic light-emitting diode, and a plurality of top driving elements under the top-emissive organic light-emitting diode, the top driving elements being configured to drive the top-emissive organic light-emitting diode.

4 Claims, 5 Drawing Sheets

(51) Int. Cl.
*H10K 59/121* (2023.01)
*H01L 27/12* (2006.01)
*H10K 59/12* (2023.01)
*H10K 102/00* (2023.01)

(52) U.S. Cl.
CPC ....... *H10K 59/126* (2023.02); *H10K 59/1213* (2023.02); *H10K 59/38* (2023.02); *H01L 27/1214* (2013.01); *H10K 59/1201* (2023.02); *H10K 2102/3031* (2023.02)

(58) Field of Classification Search
CPC .............. H01L 27/1214; H01L 27/322; H01L 51/5234; H01L 51/5218; H01L 2251/048; H01L 2251/5307; H10K 59/126; H10K 59/128; H10K 59/1213; H10K 59/38; H10K 59/80524; H10K 59/80518; H10K 59/90; H10K 59/95; H10K 50/828; H10K 50/818; H10K 2102/3023; H10K 2102/3031; G02F 1/133342
See application file for complete search history.

(56) References Cited

U.S. PATENT DOCUMENTS

| | | | | |
|---|---|---|---|---|
| 2005/0151830 A1* | 7/2005 | Yamazaki | ................ | G09G 3/20 347/238 |
| 2005/0269967 A1 | 12/2005 | Park et al. | | |
| 2013/0187131 A1* | 7/2013 | Chung | ................ | H01L 51/5296 257/40 |
| 2014/0077725 A1* | 3/2014 | Lee | ...................... | G09G 3/3225 315/312 |
| 2014/0175390 A1 | 6/2014 | Kim et al. | | |
| 2015/0236308 A1 | 8/2015 | Kim et al. | | |
| 2017/0012086 A1 | 1/2017 | Kim et al. | | |

FOREIGN PATENT DOCUMENTS

| | | |
|---|---|---|
| CN | 103887319 A | 6/2014 |
| CN | 203644784 U | 6/2014 |
| DE | 103 61 006 A1 | 8/2004 |
| KR | 10-1275810 B1 | 6/2013 |
| KR | 10-2014-0036928 A | 3/2014 |
| KR | 10-2016-0063116 A | 6/2016 |
| TW | 201332100 A | 8/2013 |

OTHER PUBLICATIONS

Chinese Office Action dated Jul. 7, 2021, issued in corresponding Chinese Patent Application No. 201811501802.5.

Office Action dated Feb. 7, 2022, issued in corresponding Korean Patent Application No. 10-2017-0174406.

* cited by examiner

DOUBLE-SIDED EMISSIVE TRANSPARENT ORGANIC LIGHT-EMITTING DIODE DISPLAY AND METHOD OF MANUFACTURING THE SAME

CROSS-REFERENCE TO RELATED APPLICATION(S)

This application claims the benefit of and priority to Korean Patent Application No. 10-2017-0174406, filed on Dec. 18, 2017, the entirety of which is hereby incorporated by reference.

BACKGROUND

1. Technical Field

The present disclosure relates to a double-sided emissive transparent organic light-emitting diode display and a method of manufacturing the same.

2. Discussion of the Related Art

Recently, various flat-panel displays, that are less bulky and more lightweight than cathode ray tube displays (CRTs), are being developed. Examples of these flat panel displays include liquid crystal displays (LCDs), field emission displays (FEDs), plasma display panels (PDPs), electroluminescence devices (ELs), etc.

Electroluminescence displays are roughly classified into inorganic electroluminescence displays and organic light-emitting diode displays, depending on the materials used for an emissive layer, and offer several advantages such as fast response time, high light-emission efficiency, high brightness, and a wide viewing angle because they are self-emissive elements. Notably, there is a rapidly increasing demand for organic light-emitting diode displays, which have high energy efficiency and less leakage current and facilitate grayscale representation through current control.

Particularly, the organic light-emitting diode displays are used as display devices with various purposes and functions, like transparent displays through which image information and the background are seen. The transparent displays are often used in outdoor environments, e.g., environments with high ambient light, such as sunlight. Thus, it is desirable that the transparent displays have high brightness to deliver accurate image information to the user. The transparent displays, especially double-sided emissive transparent displays, require improvements in structural properties to increase brightness.

SUMMARY

Accordingly, the present disclosure is directed to a double-sided emissive transparent organic light-emitting diode display and a method of manufacturing the same that substantially obviate one or more of the issues due to limitations and disadvantages of the related art.

An aspect of the disclosure is to provide a double-sided emissive transparent organic light-emitting diode display that includes a transparent area, a top light-emitting area, and a bottom light-emitting area within one pixel, and has a high aperture ratio.

Another aspect of the disclosure is to provide a transparent flat-panel display that becomes transparent when not in use to let the user see the background through, and that provides a display function when in use.

Another aspect of the disclosure is to provide a double-sided emissive transparent organic light-emitting diode display that increases or maximizes the aperture ratio by placing both driving elements of a top-emissive organic light-emitting diode and driving elements of a bottom-emissive organic light-emitting diode under the top-emissive organic light-emitting diode.

Another aspect of the disclosure is to provide a double-sided emissive transparent organic light-emitting diode display that has stable driving characteristics by placing a shielding layer between the driving elements of the top-emissive organic light-emitting diode and the driving elements of the bottom-emissive organic light-emitting diode.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided a double-sided emissive transparent organic light-emitting diode display, including: a substrate, a plurality of pixel areas, each including, on the substrate: a light transmitting area, and a light-emitting area, the light-emitting area including: a bottom light-emitting area including a bottom-emissive organic light-emitting diode, and a top light-emitting area including: a top-emissive organic light-emitting diode, a plurality of bottom driving elements under the top-emissive organic light-emitting diode, the bottom driving elements being configured to drive the bottom-emissive organic light-emitting diode, and a plurality of top driving elements under the top-emissive organic light-emitting diode, the top driving elements being configured to drive the top-emissive organic light-emitting diode.

In another aspect, there is provided a method of manufacturing a double-sided emissive transparent organic light-emitting diode display, the method including: providing a substrate, providing a plurality of pixel areas on the substrate, the providing each pixel including: providing a light transmitting area, and providing a light-emitting area, the providing the light-emitting area including: providing a bottom light-emitting area including a bottom-emissive organic light-emitting diode, and providing a top light-emitting area including: providing a top-emissive organic light-emitting diode, providing a plurality of bottom driving elements under the top-emissive organic light-emitting diode for driving the bottom-emissive organic light-emitting diode, and providing a plurality of top driving elements under the top-emissive organic light-emitting diode for driving the top-emissive organic light-emitting diode.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, that may be included to provide a further understanding of the disclosure and are incorporated in and constitute a part of this specification, illustrate embodiments of the disclosure and together with the description serve to explain various principles of the disclosure.

Figure 1:
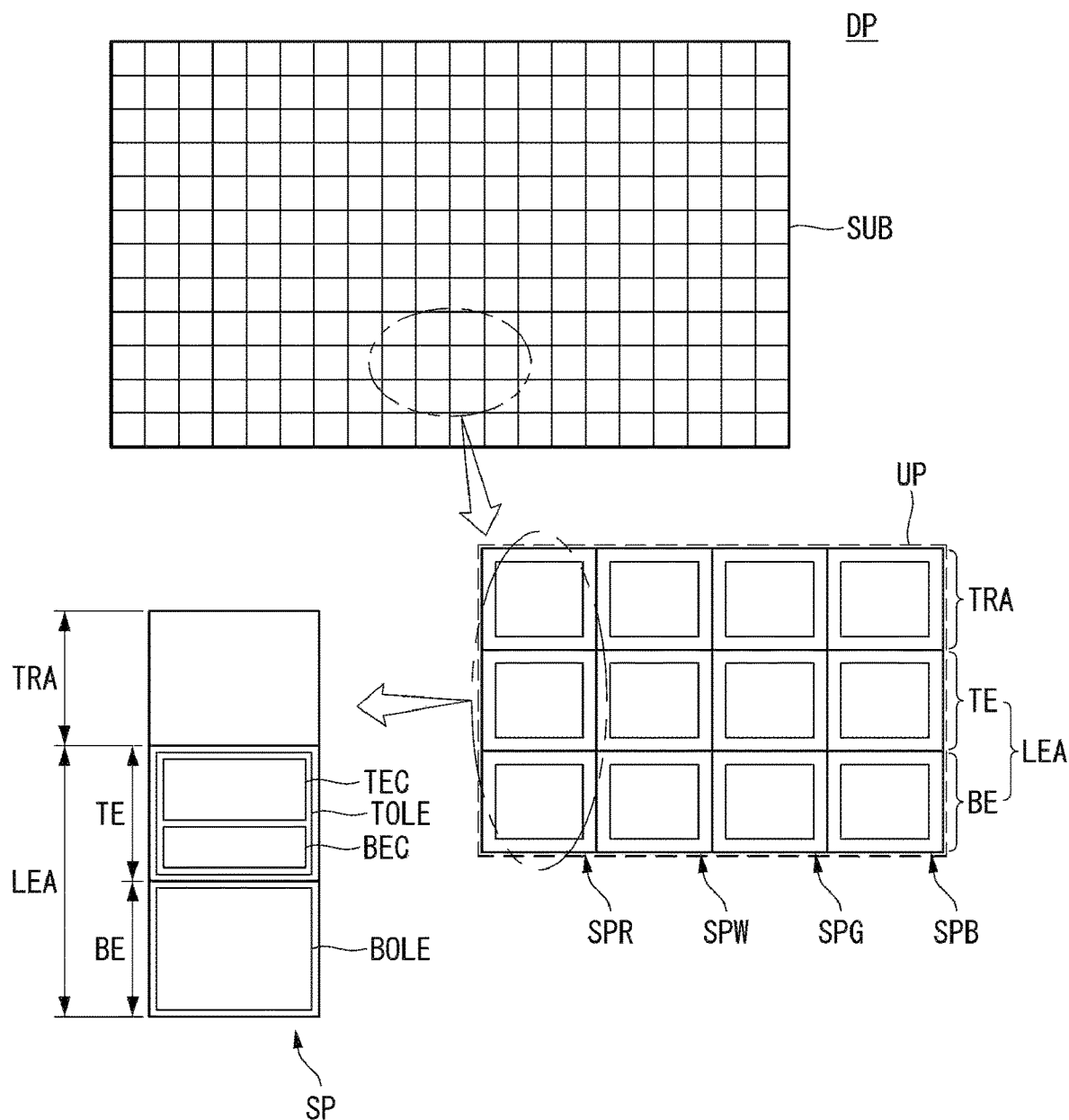
FIG. 1 is a plan view of a structure of a double-sided emissive transparent organic light-emitting diode display according to an example embodiment.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the present disclosure is only defined by scopes of claims.

A shape, a size, a ratio, an angle, and a number disclosed in the drawings for describing embodiments of the present disclosure are merely an example. Thus, the present disclosure is not limited to the illustrated details. Like reference numerals refer to like elements throughout. In the following description, when the detailed description of the relevant known function or configuration is determined to unnecessarily obscure an important point of the present disclosure, the detailed description of such known function or configuration may be omitted. In a case where terms "comprise," "have," and "include" described in the present specification are used, another part may be added unless a more limiting term, such as "only," is used. The terms of a singular form may include plural forms unless referred to the contrary.

In construing an element, the element is construed as including an error or tolerance range even where no explicit description of such an error or tolerance range. In describing a position relationship, when a position relation between two parts is described as, for example, "on," "over," "under," or "next," one or more other parts may be disposed between the two parts unless a more limiting term, such as "just" or "direct(ly)," is used.

In describing a time relationship, when the temporal order is described as, for example, "after," "subsequent," "next," or "before," a case which is not continuous may be included unless a more limiting term, such as "just," "immediate(ly)," or "direct(ly)," is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms like "first," "second," "A," "B," "(a)," and "(b)" may be used. These terms are merely for differentiating one element from another element, and the essence, sequence, order, or number of a corresponding element should not be limited by the terms. Also, when an element or layer is described as being "connected," "coupled," or "adhered" to another element or layer, the element or layer can not only be directly connected or adhered to that other element or layer, but also be indirectly connected or adhered to the other element or layer with one or more intervening elements or layers "disposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

In the description of embodiments, when a structure is described as being positioned "on or above" or "under or below" another structure, this description should be construed as including a case in which the structures contact each other as well as a case in which a third structure is disposed therebetween. The size and thickness of each element shown in the drawings are given merely for the convenience of description, and embodiments of the present disclosure are not limited thereto.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in co-dependent relationship.

In the example embodiments below, the description of an electroluminescence display will focus on an organic light-emitting display including organic light-emitting material. However, it should be noted that the technical idea of the present disclosure is not limited to organic light-emitting displays, but also may apply to inorganic light-emitting displays including inorganic light-emitting material.

Hereinafter, a double-sided emissive transparent organic light-emitting diode display according to an example embodiment of the present disclosure will be described with reference to FIG. 1. FIG. 1 is a plan view of a structure of a double-sided emissive transparent organic light-emitting diode display according to an example embodiment.

A double-sided emissive transparent organic light-emitting diode display DP, according to an embodiment of the present disclosure, may include a plurality of unit pixels UP arranged in a matrix on a substrate SUB. A single unit pixel UP may include three or four subpixels SP. For example, a single unit pixel UP may include a red subpixel SPR, a green subpixel SPG, and a blue subpixel SPB. Alternatively, a single unit pixel UP may include a red subpixel SPR, a white subpixel SPW, a green subpixel SPG, and a blue subpixel SPB. Embodiments are not limited to these examples. FIG. 1 shows that four subpixels SP may constitute a single unit pixel UP.

A single subpixel SP may include a light transmitting area TRA and a light-emitting area LEA. The light transmitting area TRA may be a transparent area through which the background on the display panel may be seen. The light-emitting area LEA may be an area in which an organic light-emitting diode may be placed to provide an image for display on the display device.

The light-emitting area LEA may include a top light-emitting area TE and a bottom light-emitting area BE. The top light-emitting area TE may be an area that provides image information to the front of the substrate SUB. The bottom light-emitting area BE may be an area that provides image information to the back of the substrate SUB.

In the top light-emitting area TE, a top-emissive organic light-emitting diode TOLE may provide image information upwards, e.g., to the front of the substrate SUB. In the bottom light-emitting area BE, a bottom-emissive organic light-emitting diode BOLE may provide image information downwards, e.g., to the back of the substrate SUB. Moreover, the top light-emitting area TE may include top-emissive organic light-emitting diode driving elements TEC for driving the top-emissive organic light-emitting diode TOLE, and bottom-emissive organic light-emitting diode driving elements BEC for driving the bottom-emissive organic light-emitting diode BOLE.

FIRST EXAMPLE EMBODIMENT

Figure 2:
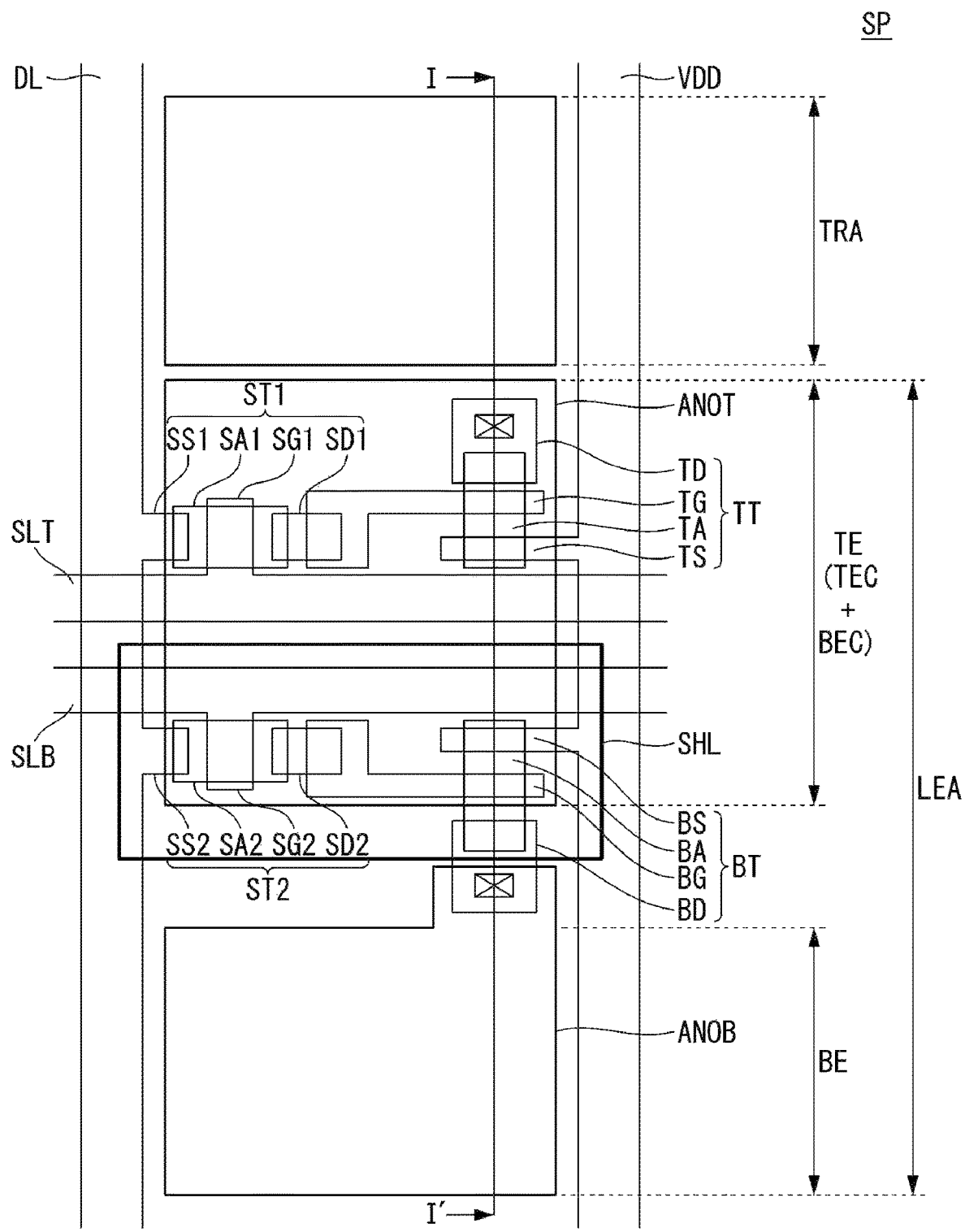
FIG. 2 is a plan view of a structure of a single pixel in a double-sided emissive transparent organic light-emitting diode display according to an example embodiment.
Figure 3:
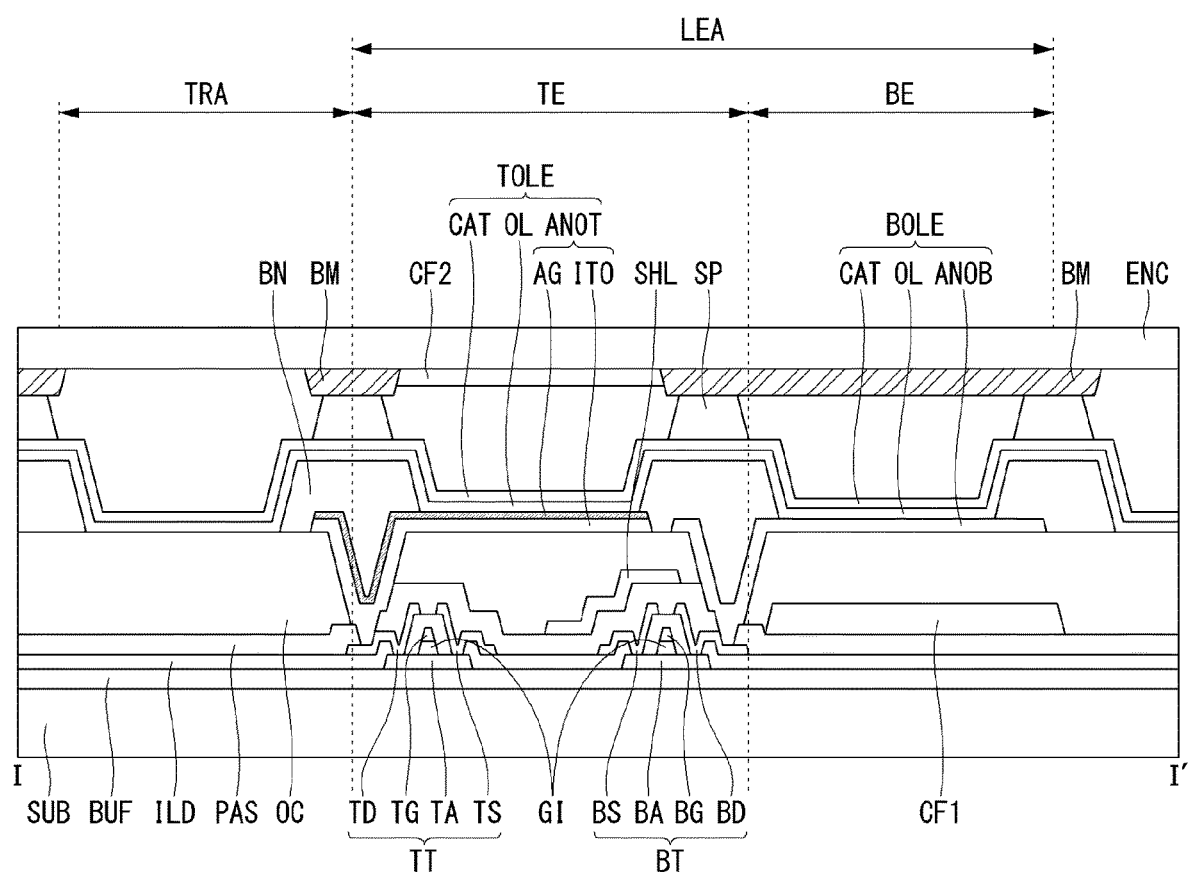
FIG. 3 is a cross-sectional view of the structure of the single pixel in the double-sided emissive transparent organic light-emitting diode display according to an example embodiment, taken along line I-I' of FIG. 2.

Hereinafter, a structure of a single pixel in a double-sided emissive transparent organic light-emitting diode display according to a first example embodiment of the present disclosure will be described in detail with reference to FIGS. 2 and 3. FIG. 2 is a plan view of a structure of a single pixel in a double-sided emissive transparent organic light-emitting diode display according to an example embodiment. FIG. 3 is a cross-sectional view of the structure of the single pixel in the double-sided emissive transparent organic light-emitting diode display according to an example embodiment, taken along line I-I' of FIG. 2.

A top scan line SLT and a bottom scan line SLB that run horizontally (or in a first direction) may be on the substrate SUB. A data line DL and a drive current line VDD that run vertically (or in a second direction) may be included. A single subpixel SP may be defined by the intersections of these lines SLT, SLB, DL, and VDD. For example, the area between the data line DL and the drive current line VDD may determine the width of the subpixel SP. The top scan line SLT and the bottom scan line SLB may run across the center of the subpixel SP.

A single subpixel SP may include a light transmitting area TRA and a light-emitting area LEA. The light-emitting area LEA may include a top light-emitting area TE and a bottom light-emitting area BE. For example, the light transmitting area TRA may be in the upper part of the subpixel SP, the top light-emitting area TE may be in the central part of the subpixel SP, and the bottom light-emitting area BE may be in the lower part of the subpixel SP. However, the pixel structure, according to embodiments, is not limited to this example, and various configurations are possible. However, the top light-emitting area TE and the bottom light-emitting area BE may be adjacent to each other.

A top-emissive organic light-emitting diode TOLE may be in the top light-emitting area TE. Top-emitting thin-film transistors ST1 and TT and bottom-emitting thin-film transistors ST2 and BT may be in the top light-emitting area TE to drive the top-emissive organic light-emitting diode TOLE. In addition, the top scan line SLT and the bottom scan line SLB may be in the top light-emitting area TE. The top-emitting thin-film transistors ST1 and TT may include a top-emitting switching thin-film transistor ST1 and a top-emitting driving thin-film transistor TT. The bottom-emitting thin-film transistors ST2 and BT may include a bottom-emitting switching thin-film transistor ST2 and a bottom-emitting driving thin-film transistor BT.

The top-emitting switching thin-film transistor may be is connected to the upper scan line SLT and the data line DL. For example, the top-emitting switching thin-film transistor ST1 may include a top-emitting switching gate electrode SG1, a top-emitting switching semiconductor layer SA1, a top-emitting switching source electrode SS1, and a top-emitting switching drain electrode SD1. The top-emitting switching gate electrode SG1 may be branched from the top scan line SLT. The top-emitting switching semiconductor layer SA1 and the top-emitting switching gate electrode SG1 may overlap each other, with a gate insulating film between them. The portion of the top-emitting switching semiconductor layer SA1 that overlaps the top-emitting switching gate electrode SG1 may be defined as a channel region.

The top-emitting switching source electrode SS1 may be branched from the data line DL, and may contact one side of the top-emitting switching semiconductor layer SA1. The one side of the top-emitting switching semiconductor layer SA1 may be an extension from one side of the channel region, which may be defined as a source region. The top-emitting switching drain electrode SD1 may contact the other side of the top-emitting switching semiconductor layer SA1. The other side of the top-emitting switching semiconductor layer SA1 may be an extension from the other side of the channel region, which may be defined as a drain region. The source region and the drain region may face each other with the channel region between them.

The top-emitting driving thin-film transistor TT may be connected to the top-emitting switching thin-film transistor ST1 and the drive current line VDD. For example, the top-emitting driving thin-film transistor TT may include a top-emitting driving gate electrode TG, a top-emitting driving semiconductor layer TA, a top-emitting driving source electrode TS, and a top-emitting driving drain electrode TD. The top-emitting driving gate electrode TG may be connected to the top-emitting switching drain electrode SD1. FIG. 2 shows that the top-emitting driving gate electrode TG may be formed by extending the top-emitting switching drain electrode SD1. The top-emitting driving semiconductor layer TA and the top-emitting driving gate electrode TG may overlap each other, with the gate insulating film between them. The portion of the top-emitting driving semiconductor layer TA that overlaps the top-emitting driving gate electrode TG may be defined as a channel region.

The top-emitting driving source electrode TS may be branched from the drive current line VDD, and may contact one side of the top-emitting driving semiconductor layer TA. The one side of the top-emitting driving semiconductor layer TA may be an extension from one side of the channel region, which may be defined as a source region. The top-emitting driving drain electrode TD may contact the other side of the top-emitting driving semiconductor layer TA. The other side of the top-emitting driving semiconductor layer TA may be an extension from the other side of the channel region, which may be defined as a drain region. The source region and the drain region may face each other, with the channel region between them.

The top-emissive organic light-emitting diode TOLE may include a top-emitting anode ANOT. The top-emitting anode ANOT may be connected to the top-emitting driving drain electrode TD of the top-emitting driving thin-film transistor TT.

The bottom-emitting thin-film transistors ST2 and BT may be under the top-emitting thin-film transistors ST1 and TT. The bottom-emitting thin-film transistors ST2 and BT may include the bottom-emitting switching thin-film transistor ST2 and the bottom-emitting driving thin-film transistor BT.

The bottom-emitting switching thin-film transistor ST2 may be connected to the bottom scan line SLB and the data line DL. For example, the top-emitting switching thin-film transistor ST2 may include a bottom-emitting switching gate electrode SG2, a bottom-emitting switching semiconductor layer SA2, a bottom-emitting switching source electrode SS2, and a bottom-emitting switching drain electrode SD2. The bottom-emitting switching gate electrode SG2 may be branched from the bottom scan line SLB. The bottom-emitting switching semiconductor layer SA2 and the bottom-emitting switching gate electrode SG2 may overlap each other, with the gate insulating film between them. The portion of the bottom-emitting switching semiconductor layer SA2 that overlaps the bottom-emitting switching gate electrode SG2 may be defined as a channel region.

The bottom-emitting switching source electrode SS2 may be branched from the data line DL, and may contact one side of the bottom-emitting switching semiconductor layer SA2. The one side of the bottom-emitting switching semiconductor layer SA2 may be an extension from one side of the channel region, which may be defined as a source region. The bottom-emitting switching drain electrode SD2 may contact the other side of the bottom-emitting switching semiconductor layer SA2. The other side of the bottom-emitting switching semiconductor layer SA2 may be an extension from the other side of the channel region, which may be defined as a drain region. The source region and the drain region may face each other, with the channel region between them.

The bottom-emitting driving thin-film transistor BT may be connected to the bottom-emitting switching thin-film transistor ST2 and the drive current line VDD. For example, the bottom-emitting driving thin-film transistor BT may include a bottom-emitting driving gate electrode BG, a bottom-emitting driving semiconductor layer BA, a bottom-emitting driving source electrode BS, and a bottom-emitting driving drain electrode BD. The bottom-emitting driving gate electrode BG may be connected to the bottom-emitting switching drain electrode SD2. FIG. 2 shows that the bottom-emitting driving gate electrode BG may be formed by extending the bottom-emitting switching drain electrode SD2. The bottom-emitting driving semiconductor layer BA and the bottom-emitting driving gate electrode BG may overlap each other, with the gate insulating film between them. The portion of the bottom-emitting driving semiconductor layer BA that overlaps the bottom-emitting driving gate electrode BG may be defined as a channel region.

The bottom-emitting driving source electrode BS may be branched from the drive current line VDD, and may contact one side of the bottom-emitting driving semiconductor layer BA. The one side of the bottom-emitting driving semiconductor layer BA may be an extension from one side of the channel region, which may be defined as a source region. The bottom-emitting driving drain electrode BD may contact the other side of the bottom-emitting driving semiconductor layer BA. The other side of the bottom-emitting driving semiconductor layer BA may be an extension from the other side of the channel region, which may be defined as a drain region. The source region and the drain region may face each other with the channel region between them.

The bottom-emissive organic light-emitting diode BOLE may include a bottom-emitting anode ANOB. The bottom-emitting anode ANOB may be connected to the bottom-emitting driving drain electrode BD of the bottom-emitting driving thin-film transistor BT.

The top-emitting anode ANOT of the top-emissive organic light-emitting diode TOLE may be shaped to cover all of the top-emitting thin-film transistors ST1 and TT and bottom-emitting thin-film transistors ST2 and BT. Because the top-emissive organic light-emitting diode TOLE may provide light to the top of the substrate SUB, driving elements that provide no light may be under the top-emissive organic light-emitting diode TOLE to increase or maximize the aperture area of the top-emissive organic light-emitting diode TOLE.

Driving elements, which may provide no light, may be under the bottom-emissive organic light-emitting diode TOLE because the bottom-emissive organic light-emitting diode BOLE may provide light to the bottom of the substrate SUB. That is, all of the driving elements of the bottom-emissive organic light-emitting diode BOLE may be under the top-emissive organic light-emitting diode TOLE.

The driving elements of the bottom-emissive organic light-emitting diode BOLE may be stacked under the top-emitting anode ANOT of the top-emissive organic light-emitting diode TOLE. Thus, the driving elements ST2 and BT of the bottom-emissive organic light-emitting diode BOLE may be electrically impacted by an electrical signal from the top-emitting anode ANOT. That is, the bottom-emissive organic light-emitting diode BOLE may not work properly. To reduce or prevent this problem, the double-sided emissive transparent organic light-emitting diode display according to an example embodiment of the present disclosure may further include a shielding layer SHL that covers the driving elements of the bottom-emissive organic light-emitting diode BOLE.

FIG. 2 shows that the shielding layer SHL may have a shape of an island that covers the bottom-emitting switching thin-film transistor ST2 and bottom-emitting driving thin-film transistor BT in a single subpixel SP, but embodiments are not limited to this structure. For example, the shielding layer SHL may overlap the top-emitting anode ANOT of the overlying top-emissive organic light-emitting diode TOLE, thereby accumulating inductive charges. These inductive charges may be released out. Thus, the shielding layer SHL may have the shape of a strip that extends horizontally. For example, the shielding layer SHL may run across the substrate SUB in the shape of lines that cover all the bottom-emitting switching thin-film transistors ST2 and bottom-emitting driving thin-film transistors BT of all subpixels SP arranged in series horizontally. Moreover, the shielding layer SHL may be connected to a ground line on the left side and/or right side of the substrate SUB, and may release the accumulated inductive charges.

FIG. 2 shows an example in which the shielding layer SHL covers the bottom-emitting switching thin-film transistor ST2 and the bottom-emitting driving thin-film transistor BT. However, embodiments including the shielding layer SHL are not limited to this example. For example, the shielding layer SHL may cover the top-emitting switching thin-film transistor ST1 and the top-emitting driving thin-film transistor TT, as well. Alternatively, the shielding layer SHL may cover only the bottom-emitting driving thin-film transistor BT. As another example, the shielding layer SHL may be formed just large enough to cover part of the bottom-emitting driving thin-film transistor BT, e.g., the channel region.

Hereinafter, with further reference to FIG. 3, a cross-sectional structure of the double-sided emissive transparent organic light-emitting diode display according to the first example embodiment of the present disclosure will be described in detail. A buffer layer BUF may be over the entire surface of the substrate SUB. Semiconductor layers may be formed over the buffer layer BUF. The semiconductor layers may include a top-emitting switching semiconductor layer SA1, a top-emitting driving semiconductor layer TA, a bottom-emitting switching semiconductor layer SA2, and a top-emitting driving semiconductor layer BA. The top-emitting switching semiconductor layer SA1 and the bottom-emitting switching semiconductor layer SA2 are not illustrated in FIG. 3 because FIG. 3, which is a cross-sectional view, shows a cutaway view of the top-emitting driving thin-film transistor TT and bottom-emitting driving thin-film transistor BT.

The center of the top-emitting driving semiconductor layer TA and the top-emitting driving gate electrode TG may overlap each other, with a gate insulating film GI between them. Likewise, the center of the bottom-emitting driving semiconductor layer BA and the bottom-emitting driving gate electrode BG may overlap each other, with the gate insulating film GI between them.

An interlayer insulating film ILD may be stacked over the entire surface of the substrate SUB where the top-emitting driving gate electrode TG and the bottom-emitting driving gate electrode BG may be provided. The top-emitting driving source electrode TS, the top-emitting driving drain electrode TD, the bottom-emitting driving source electrode BS, and the bottom-emitting driving drain electrode BD may be on the interlayer insulating film ILD.

A passivation film PAS may be over the entire surface of the substrate SUB where the top-emitting driving thin-film transistor TT and bottom-emitting driving thin-film transistor BT may be provided. A shielding layer SH covering the bottom-emitting driving thin-film transistor BT may be over the passivation film PAS. Also, a lower color filter CF1 may be on the passivation film PAS. The lower color filter CF1 may be selectively provided only in the bottom light-emitting area BE.

A planarization film OC may be stacked over the entire surface of the substrate SUB where the shielding layer SHL and the lower color filter CF1 may be provided. A top-emitting anode ANOT and a bottom-emitting anode ANOB may be on the planarization film OC. The top-emitting anode ANOT may be only in the top light-emitting area TE and connected to the top-emitting driving drain electrode TD of the top-emitting driving thin-film transistor TT. The bottom-emitting anode ANOB may be only in the bottom light-emitting area BE and connected to the bottom-emitting driving drain electrode BD of the bottom-emitting driving thin-film transistor BT.

The top-emitting anode ANOT may include a transparent conductive layer ITO and a reflective electrode layer AG stacked on each other. The bottom-emitting anode ANOB may include only a transparent conductive layer. For example, the top-emitting anode ANOT and the bottom-emitting anode ANOB may be formed at substantially the same time by applying a transparent conductive material, such as indium tin oxide or indium zinc oxide, and a light reflective material, such as aluminum (Al), silver (Ag), molybdenum (Mo), or titanium (Ti), in a row, and patterning them, e.g., using a half-tone mask. Embodiments are not limited to these example materials. The top-emitting anode ANOT may include a reflective electrode layer AG stacked on a transparent conductive layer ITO. On the other hand, the bottom-emitting anode ANOB may include only a transparent conductive layer.

A bank BN may be on the entire surface of the substrate SUB where the top-emitting anode ANOT and the bottom-emitting anode ANOB may be provided. The bank BN may define the top light-emitting area TE and the bottom light-emitting area BE. For example, the bank BN may be an opening that exposes most of the center of the top-emitting anode ANOT, and may define the top light-emitting area TE. Also, the bank BN may be an opening that exposes most of the center of the bottom-emitting anode ANOB, and may define the bottom light-emitting area BE. The bank BN may include an opening that exposes most of the center of the light transmitting area TRA, as well.

An organic emission layer OL may be over the entire surface of the substrate SUB where the bank BN may be provided. A cathode CAT may be stacked on the organic emission layer OL, across the entire surface of the substrate SUB. As a result, a top-emissive organic light-emitting diode TOLE may be formed in the top light-emitting area TE by sequentially stacking the top-emitting anode ANOT, the organic emission layer OL, and the cathode CAT. Also, a bottom-emissive organic light-emitting diode BOLE may be formed in the bottom light-emitting area BE by sequentially stacking the bottom-emitting anode ANOB, the organic emission layer OL, and the cathode CAT. The transparent area TRA may remain transparent because only the organic emission layer OL and the cathode CAT may be stacked in the transparent area TRA.

A spacer SP may be stacked on the bank BN. The spacer SP may be stacked directly on top of the bank BN, or may be on top of the cathode CAT stacked on the bank BN.

An encapsulation substrate ENC may be bonded onto the substrate SUB where display elements may be located, with the spacer SP in between. For example, a passivation film or passivation material (not shown) may be filled between the encapsulation substrate ENC and the substrate SUB.

A black matrix BM and an upper color filter CF2 may be on the encapsulation substrate SUB. The black matrix BM may face the bank BN. The upper color filter CF2 may be only in the top light-emitting area TE. For example, the upper color filter CF2 may be between the black matrix BM surrounding the top light-emitting area TE.

SECOND EXAMPLE EMBODIMENT

Figure 4:
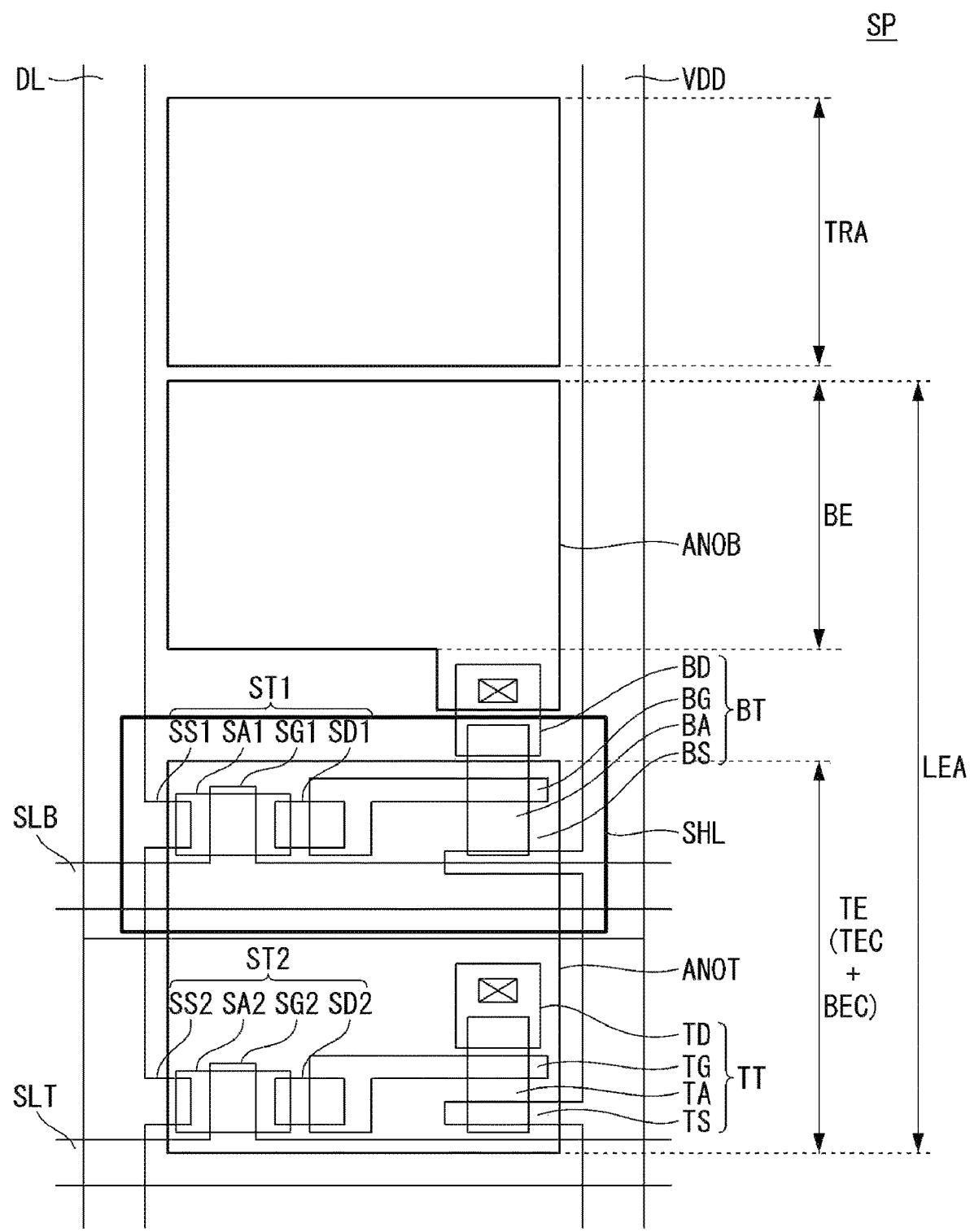
FIG. 4 is a plan view of a structure of a single pixel in a double-sided emissive transparent organic light-emitting diode display according to an example embodiment.

Hereinafter, a second example embodiment of the present disclosure will be described with reference to FIG. 4. FIG. 4 is a plan view of a structure of a single pixel in a double-sided emissive transparent organic light-emitting diode display according to an example embodiment.

In the second example embodiment, a double-sided emissive transparent organic light-emitting diode display having a different structure on the plane will be described. The basic structure of the double-sided emissive transparent organic light-emitting diode display according to the second example embodiment of the present disclosure is substantially similar to that of the first example embodiment, except for the positional relationship between the top light-emitting area TE and the bottom light-emitting area BE.

A top scan line SLT and a bottom scan line SLB that run horizontally (or in a first direction) may be on the substrate SUB. A data line DL and a drive current line VDD that run vertically (or in a second direction) may be provided. A single subpixel SP may be defined by the intersections of these lines SLT, SLB, DL, and VDD. For example, the area between the data line DL and the drive current line VDD may determine the width of the subpixel SP. The top scan line SLT and the bottom scan line SLB may run across the lower part of the subpixel SP. That is, the area between two top scan lines SLT may determine the length of one subpixel SP.

A single subpixel SP may include a light transmitting area TRA and a light-emitting area LEA. The light-emitting area LEA may include a top light-emitting area TE and a bottom light-emitting area BE. For example, the light transmitting area TRA may be placed in the upper part of the subpixel SP, the bottom light-emitting area BE may be placed in the central part of the subpixel SP, and the top light-emitting area TE may be placed in the lower part of the subpixel SP.

A top-emissive organic light-emitting diode TOLE may be in the top light-emitting area TE. Top-emitting thin-film transistors ST1 and TT and bottom-emitting thin-film transistors ST2 and BT may be in the top light-emitting area TE, and may drive the top-emissive organic light-emitting diode TOLE. In addition, the top scan line SLT and the bottom scan line SLB may be in the top light-emitting area TE. The top-emitting thin-film transistors ST1 and TT may include a top-emitting switching thin-film transistor ST1 and a top-emitting driving thin-film transistor TT. The bottom-emitting thin-film transistors ST2 and BT may include a bottom-emitting switching thin-film transistor ST2 and a bottom-emitting driving thin-film transistor BT.

The top-emitting switching thin-film transistor ST1 may be connected to the upper scan line SLT and the data line DL. For example, the top-emitting switching thin-film transistor ST1 may include a top-emitting switching gate electrode SG1, a top-emitting switching semiconductor layer SA1, a top-emitting switching source electrode SS1, and a top-emitting switching drain electrode SD1.

The top-emitting driving thin-film transistor TT may be connected to the top-emitting switching thin-film transistor ST1 and the drive current line VDD. For example, the top-emitting driving thin-film transistor TT may include a top-emitting driving gate electrode TG, a top-emitting driving semiconductor layer TA, a top-emitting driving source electrode TS, and a top-emitting driving drain electrode TD.

The top-emitting driving gate electrode TG may be connected to the top-emitting switching drain electrode SD1.

The top-emissive organic light-emitting diode TOLE may include a top-emitting anode ANOT. The top-emitting anode ANOT may be connected to the top-emitting driving drain electrode TD of the top-emitting driving thin-film transistor TT.

The bottom-emitting thin-film transistors may include the bottom-emitting switching thin-film transistor ST2 and the bottom-emitting driving thin-film transistor BT. The bottom-emitting switching thin-film transistor ST2 may be connected to the bottom scan line SLB and the data line DL. For example, the top-emitting switching thin-film transistor ST2 may include a bottom-emitting switching gate electrode SG2, a bottom-emitting switching semiconductor layer SA2, a bottom-emitting switching source electrode SS2, and a bottom-emitting switching drain electrode SD2.

The bottom-emitting driving thin-film transistor BT may be connected to the bottom-emitting switching thin-film transistor ST2 and the drive current line VDD. For example, the bottom-emitting driving thin-film transistor BT may include a bottom-emitting driving gate electrode BG, a bottom-emitting driving semiconductor layer BA, a bottom-emitting driving source electrode BS, and a bottom-emitting driving drain electrode BD. The bottom-emitting driving gate electrode BG may be connected to the bottom-emitting switching drain electrode SD2.

The bottom-emissive organic light-emitting diode BOLE may include a bottom-emitting anode ANOB. The bottom-emitting anode ANOB may be connected to the bottom-emitting driving drain electrode BD of the bottom-emitting driving thin-film transistor BT.

The top-emitting anode ANOT of the top-emissive organic light-emitting diode TOLE may be shaped to cover all of the top-emitting thin-film transistors ST1 and TT and bottom-emitting thin-film transistors ST2 and BT. Because the top-emissive organic light-emitting diode TOLE may provide light to the top of the substrate SUB, driving elements that provide no light may be under the top-emissive organic light-emitting diode TOLE to increase or maximize the aperture area of the top-emissive organic light-emitting diode TOLE.

Driving elements, which may provide no light, may be under the bottom-emissive organic light-emitting diode TOLE because the bottom-emissive organic light-emitting diode BOLE may provide light to the bottom of the substrate SUB. That is, all of the driving elements of the bottom-emissive organic light-emitting diode BOLE may be under the top-emissive organic light-emitting diode TOLE.

The driving elements of the bottom-emissive organic light-emitting diode BOLE may be stacked under the top-emitting anode ANOT of the top-emissive organic light-emitting diode TOLE. Thus, the driving elements ST2 and BT of the bottom-emissive organic light-emitting diode BOLE may be electrically impacted by an electrical signal from the top-emitting anode ANOT. That is, the bottom-emissive organic light-emitting diode BOLE may not work properly. To reduce or prevent this problem, the double-sided emissive transparent organic light-emitting diode display according to an example embodiment of the present disclosure further may include a shielding layer SHL that covers the driving elements of the bottom-emissive organic light-emitting diode BOLE.

FIG. 4 illustrates an example in which the shielding layer SHL has the shape of a strip that extends horizontally. The shielding layer SHL may run across the substrate SUB in the shape of lines that cover all the bottom-emitting switching thin-film transistors ST2 and bottom-emitting driving thin-film transistors BT of all subpixels SP. FIG. 4 shows an example in which the shielding layer SHL covers the bottom-emitting switching thin-film transistor ST2 and the bottom-emitting driving thin-film transistor BT. However, embodiments including the shielding layer SHL are not limited to this example, but may cover the top-emitting switching thin-film transistor ST1 and the top-emitting driving thin-film transistor TT, as well. Alternatively, the shielding layer SHL may only cover the bottom-emitting driving thin-film transistor BT. For example, the shielding layer SHL may be just large enough to cover part of the bottom-emitting driving thin-film transistor BT, for example, the channel region.

The shielding layer SHL may overlap the top-emitting anode ANOT of the top-emissive organic light-emitting diode TOLE lying over it, thereby accumulating inductive charges. These inductive charges may be released out. Thus, the shielding layer SHL may be connected to a ground line on the left side and/or right side of the substrate SUB, and may release the accumulated inductive charges.

THIRD EXAMPLE EMBODIMENT

Figure 5:
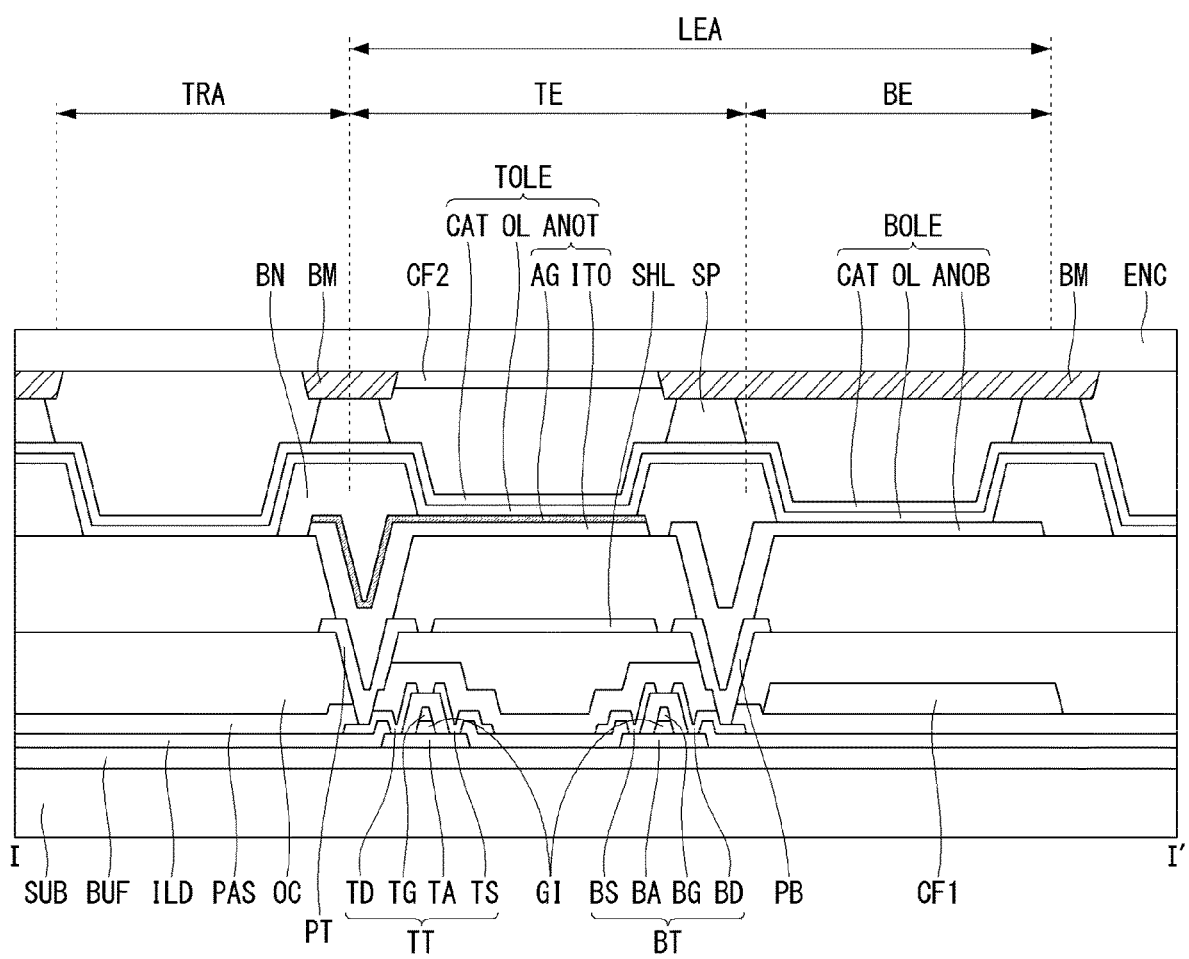
FIG. 5 is a cross-sectional view of a structure of a single pixel in a double-sided emissive transparent organic light-emitting diode display according to an example embodiment.

Hereinafter, a third example embodiment of the present disclosure will be described with reference to FIG. 5. FIG. 5 is a cross-sectional view of a structure of a single pixel in a double-sided emissive transparent organic light-emitting diode display according to an example embodiment.

In the third example embodiment, a double-sided emissive transparent organic light-emitting diode display having a different structure on the cross-section will be described. A buffer layer BUF may be over the entire surface of the substrate SUB. Semiconductor layers may be over the buffer layer BUF. The semiconductor layers may include a top-emitting switching semiconductor layer SA1, a top-emitting driving semiconductor layer TA, a bottom-emitting switching semiconductor layer SA2, and a top-emitting driving semiconductor layer BA. The top-emitting switching semiconductor layer SA1 and the bottom-emitting switching semiconductor layer SA2 are not illustrated in FIG. 5 because FIG. 5, which is a cross-sectional view, shows a cutaway view of the top-emitting driving thin-film transistor TT and bottom-emitting driving thin-film transistor BT.

The center of the top-emitting driving semiconductor layer TA and the top-emitting driving gate electrode TG may overlap each other, with a gate insulating film GI between them. Likewise, the center of the bottom-emitting driving semiconductor layer BA and the bottom-emitting driving gate electrode BG may overlap each other, with the gate insulating film GI between them.

An interlayer insulating film ILD may be stacked over the entire surface of the substrate SUB where the top-emitting driving gate electrode TG and the bottom-emitting driving gate electrode BG may be provided. The top-emitting driving source electrode TS, the top-emitting driving drain electrode TD, the bottom-emitting driving source electrode BS, and the bottom-emitting driving drain electrode BD may be on the interlayer insulating film ILD.

A passivation film PAS may be over the entire surface of the substrate SUB where the top-emitting driving thin-film transistor TT and bottom-emitting driving thin-film transistor BT may be provided. A lower color filter CF1 may be on the passivation film PAS. The lower color filter CF1 may be selectively provided only in the bottom light-emitting area BE.

A first planarization film OC1 may be stacked over the entire surface of the substrate SUB where the lower color filter CF1 are formed. A top-emitting pixel electrode PT, a bottom-emitting pixel electrode PB, and a shielding layer SHL may be on the first planarization film OC1.

The top-emitting pixel electrode PT may be connected to the top-emitting driving drain electrode TD via a contact hole formed through the first planarization film OC1. The bottom-emitting pixel electrode PB may be connected to the bottom-emitting driving drain electrode BD via a contact hole formed through the first planarization film OC1. The shielding layer SHL may be shaped to cover the bottom-emitting switching thin-film transistor ST2 and bottom-emitting driving thin-film transistor BT. The shielding layer SHL may be separated from the top-emitting pixel electrode PT and the bottom-emitting pixel electrode PB.

The top-emitting pixel electrode PT and the bottom-emitting pixel electrode PB may be stacked on the first planarization film OC1, and a second planarization film OC2 may be stacked over the entire surface of the substrate SUB where the shielding layer SHL may be provided. A top-emitting anode ANOT and a bottom-emitting anode ANOB may be on the second planarization film OC2. The top-emitting anode ANOT may be only in the top light-emitting area TE, and may be connected to the top-emitting driving drain electrode TD of the top-emitting driving thin-film transistor TT. The bottom-emitting anode ANOB may be only in the bottom light-emitting area BE, and may be connected to the bottom-emitting driving drain electrode BD of the bottom-emitting driving thin-film transistor BT.

The top-emitting anode ANOT may include a transparent conductive layer ITO and a reflective electrode layer AG stacked on each other. The bottom-emitting anode ANOB may include only a transparent conductive layer. For example, the transparent conductive layer ITO may include a transparent conductive material, such as indium tin oxide or indium zinc oxide. The reflective electrode AG may include a light reflective material, such as aluminum (Al), silver (Ag), molybdenum (Mo), or titanium (Ti). Embodiments are not limited to these example materials.

A bank BN may be on the entire surface of the substrate SUB where the top-emitting anode ANOT and the bottom-emitting anode ANOB may be provided. The bank BN may define the top light-emitting area TE and the bottom light-emitting area BE. For example, the bank BN may be an opening that exposes most of the center of the top-emitting anode ANOT, and may define the top light-emitting area TE. The bank BN may be an opening that exposes most of the center of the bottom-emitting anode ANOB, and may define the bottom light-emitting area BE. The bank BN may include an opening that exposes most of the center of the light transmitting area TRA, as well.

An organic emission layer OL may be over the entire surface of the substrate SUB where the bank BN may be provided. A cathode CAT may be stacked on the organic emission layer OL, across the entire surface of the substrate SUB. As a result, a top-emissive organic light-emitting diode TOLE may be formed in the top light-emitting area TE by sequentially stacking the top-emitting anode ANOT, the organic emission layer OL, and the cathode CAT. A bottom-emissive organic light-emitting diode BOLE may be formed in the bottom light-emitting area BE by sequentially stacking the bottom-emitting anode ANOB, the organic emission layer OL, and the cathode CAT. The transparent area TRA may remain transparent because only the organic emission layer OL and the cathode CAT may be stacked in the transparent area TRA.

A spacer SP may be stacked on the bank BN. The spacer SP may be stacked directly on top of the bank BN, or may be formed on top of the cathode CAT stacked on the bank BN.

An encapsulation substrate ENC may be bonded onto the substrate SUB where display elements may be provided, with the spacer SP in between. For example, a passivation film or passivation material (not shown) may be filled between the encapsulation substrate ENC and the substrate SUB.

A black matrix BM and an upper color filter CF2 may be on the encapsulation substrate SUB. The black matrix BM may face the bank BN. The upper color filter CF2 may be only in the top light-emitting area TE. For example, the upper color filter CF2 may be between the black matrix BM surrounding the top light-emitting area TE.

As seen from above, the double-sided emissive transparent organic light-emitting diode display may include a light transmitting area TRA through which the background on the display panel may be seen, may provide a display function when in use, and may become transparent when not in use. Also, when in use, an augmented reality display function, which may be a combination of the background and the display function, may be provided.

For example, the double-sided emissive transparent organic light-emitting diode display according to an example embodiment of the present disclosure may provide the display function both to the front and back of the display device. Accordingly, the display device may provide the user with image information both on the front and back. With this double-sided emissive structure, the double-sided emissive transparent organic light-emitting diode display may increase or maximize the aperture ratio by placing both driving elements of a top-emissive organic light-emitting diode and driving elements of a bottom-emissive organic light-emitting diode under the top-emissive organic light-emitting diode.

It will be apparent to those skilled in the art that various modifications and variations may be made in the present disclosure without departing from the technical idea or scope of the disclosure. Thus, it may be intended that embodiments of the present disclosure cover the modifications and variations of the disclosure provided they come within the scope of the appended claims and their equivalents.

What is claimed is:

1. A double-sided emissive transparent organic light-emitting diode display, comprising:
   a substrate;
   a plurality of pixel areas, each comprising, on the substrate:
   a light transmitting area; and
   a light-emitting area, the light-emitting area comprising:
   a bottom light-emitting area comprising a bottom-emissive organic light-emitting diode; and
   a top light-emitting area comprising:
   a top-emissive organic light-emitting diode, the top-emissive organic light-emitting diode comprising:
   a top-emitting anode;
   an organic emission layer; and
   a cathode;
   a plurality of bottom driving elements under the top-emitting anode, the plurality of bottom driving elements being configured to drive the bottom-emissive organic light-emitting diode, wherein the plurality of bottom driving elements comprises a bottom switching thin-film transistor and a bottom driving thin-film transistor, and wherein the bottom driving thin-film transistor is connected to the bottom switching thin-film transistor and the bottom-emissive organic light-emitting diode;
   a plurality of top driving elements under the top-emitting anode, the plurality of top driving elements being configured to drive the top-emissive organic light-emitting diode, wherein the plurality of top driving elements comprises a top switching thin-film transistor and a top driving thin-film transistor, and wherein the top driving thin-film transistor is connected to the top switching thin-film transistor and the top-emissive organic light-emitting diode;
   a passivation film covering the bottom driving thin-film transistor and the top driving thin-film transistor;
   a shielding layer on the passivation film, the shielding layer covering the bottom switching thin-film transistor and the bottom driving thin-film transistor, but not covering the top switching thin-film transistor and the top driving thin-film transistor, the shielding layer interposed between the top-emitting anode of the top-emissive organic light-emitting diode and the plurality of bottom driving elements, the shielding layer being spaced apart from the top-emitting anode, the shielding layer being interposed between the plurality of bottom driving elements and the plurality of top driving elements, the shielding layer being electrically insulated from the top-emitting anode of the top-emissive organic light-emitting diode; and
   a first planarization film covering the passivation film and the shielding layer,
   wherein the top-emitting anode of the top-emissive organic light-emitting diode is on the first planarization film.

2. The double-sided emissive transparent organic light-emitting diode display of claim 1, further comprising:
   a data line and a drive current line provided in a first direction on the substrate; and
   a first scan line and a second scan line provided in a second direction on the substrate, the second direction being different from the first direction,
   wherein the plurality of bottom driving elements comprises:
   the bottom switching thin-film transistor connected to the data line and the first scan line, and
   the bottom driving thin-film transistor connected to the drive current line, the bottom switching thin-film transistor, and the bottom-emissive organic light-emitting diode, and
   wherein the plurality of the top driving elements comprises:
   the top switching thin-film transistor connected to the data line and the second scan line; and
   the top driving thin-film transistor connected to the drive current line, the top switching thin-film transistor, and the top-emissive organic light-emitting diode.

3. The double-sided emissive transparent organic light-emitting diode display of claim 1, wherein:
   the bottom-emissive organic light-emitting diode comprises:
   a first anode composed solely of a transparent conductive material;
   a first organic emission layer stacked on the first anode; and
   a first cathode stacked on the first organic emission layer; and
   the top-emissive organic light-emitting diode comprises:

a second anode comprising the transparent conductive material and a reflective metal material stacked over the transparent conductive material;

the organic emission layer stacked on the second anode; and the cathode stacked on the organic emission layer.

4. The double-sided emissive transparent organic light-emitting diode display of claim 1, wherein:

the cathode of the top-emissive organic light-emitting diode has a horizontal section over the top-emitting anode of the top-emissive organic light-emitting diode; and the shielding layer is located under a portion of the horizontal section of the cathode of the top-emissive organic light-emitting diode, but not under all of the horizontal section of the cathode of the top-emissive organic light-emitting diode.

\* \* \* \* \*